United States Patent
Low et al.

(10) Patent No.: US 7,732,259 B2
(45) Date of Patent: Jun. 8, 2010

(54) NON-LEADED SEMICONDUCTOR PACKAGE AND A METHOD TO ASSEMBLE THE SAME

(75) Inventors: Min Wee Low, Singapore (SG); Tian Siang Yip, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 284 days.

(21) Appl. No.: 10/598,390

(22) PCT Filed: Feb. 26, 2004

(86) PCT No.: PCT/IB2004/000496

§ 371 (c)(1),
(2), (4) Date: Jul. 9, 2008

(87) PCT Pub. No.: WO2005/091353

PCT Pub. Date: Sep. 29, 2005

(65) Prior Publication Data

US 2008/0258276 A1  Oct. 23, 2008

(51) Int. Cl.
*H01L 21/50* (2006.01)
(52) U.S. Cl. ............ 438/123; 438/108; 438/111; 438/112; 257/66; 257/676; 257/E23.037; 257/E21.51
(58) Field of Classification Search ............ 438/123, 438/111–112; 257/333–676
See application file for complete search history.

(56) References Cited

U.S. PATENT DOCUMENTS

| | | | |
|---|---|---|---|
| 4,963,414 A * | 10/1990 | LeVasseur et al. ........ 428/195.1 |
| 6,143,981 A | 11/2000 | Glenn | |
| 6,294,100 B1 | 9/2001 | Fan et al. | |
| 6,342,730 B1 | 1/2002 | Jung et al. | |
| 6,498,099 B1 | 12/2002 | McLellan et al. | |
| 2002/0027010 A1 | 3/2002 | Glenn | |
| 2003/0034697 A1 * | 2/2003 | Goldner et al. ............ 310/17 |
| 2004/0017668 A1 | 1/2004 | Siegel et al. | |
| 2004/0110319 A1 * | 6/2004 | Fukutomi et al. .......... 438/106 |

FOREIGN PATENT DOCUMENTS

| EP | 1180792 | 2/2002 |
|---|---|---|
| TW | 486 795 | 5/2002 |

* cited by examiner

*Primary Examiner*—Dung A. Le
(74) *Attorney, Agent, or Firm*—Dicke, Billig & Czaja, PLLC

(57) ABSTRACT

A method to assemble a non-leaded semiconductor package is disclosed. In one embodiment, a carrier tape is attached to a metal foil. A plurality of leadframes are formed in the metal foil, each leadframe including a die pad laterally surrounded by a plurality of contact leads. A semiconductor die, including an active surface with a plurality of die contact pads, is attached to each die attach pad and electrically connected to the leadframe by a plurality of bond wires connecting the die contact pads and the lead contact areas of the contact leads. A plurality of leadframes, each including a wire bonded semiconductor die, are encapsulated with mold material. The carrier tape is removed and the non-leaded semiconductor packages separated.

16 Claims, 2 Drawing Sheets

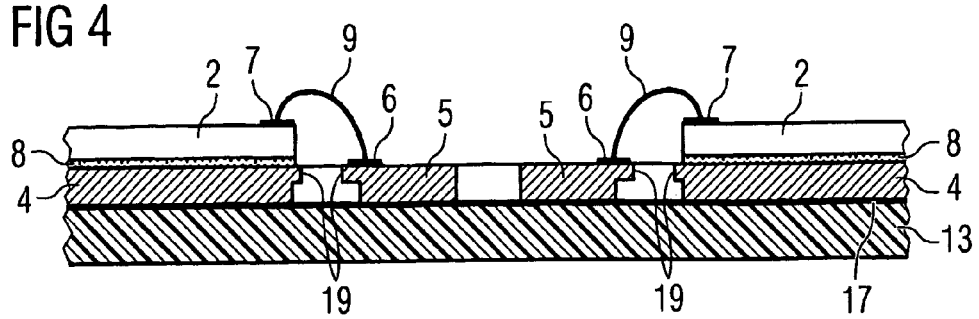
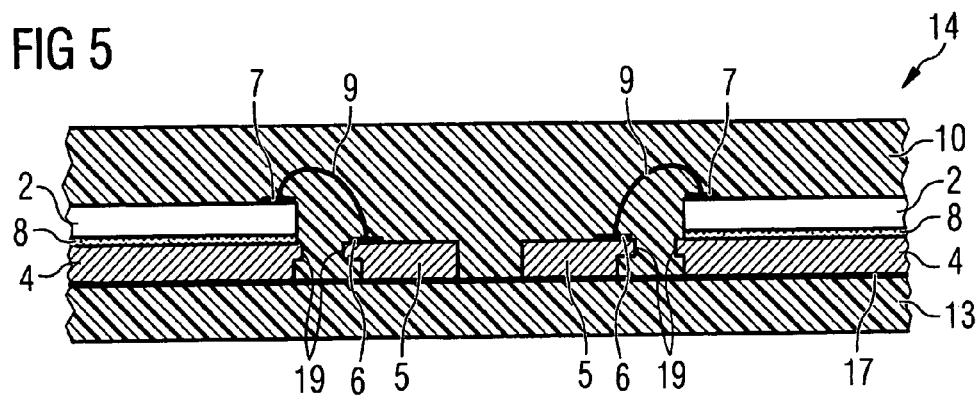
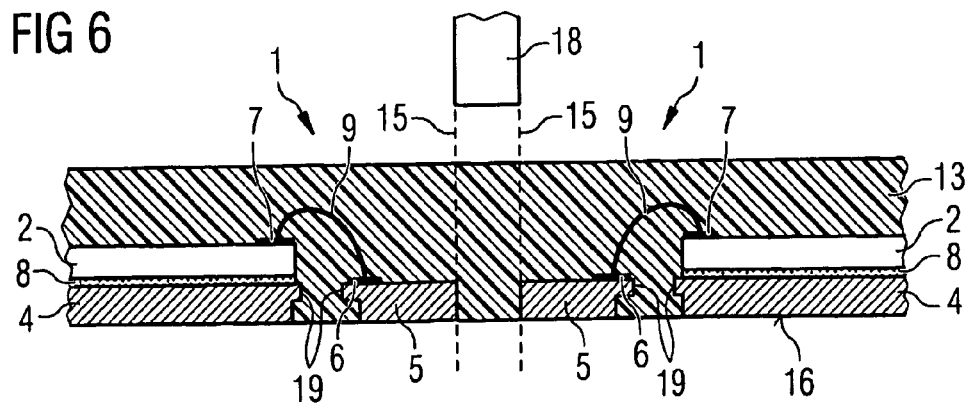

NON-LEADED SEMICONDUCTOR PACKAGE AND A METHOD TO ASSEMBLE THE SAME

FIELD OF THE INVENTION

The invention provides a non-leaded semiconductor package and to a method of assembling a non-leaded semiconductor package.

BACKGROUND

U.S. Pat. No. 6,498,099 discloses a method to produce a leadless semiconductor package by half etching one or both sides of the leadframe strip. After the wire bonding and molding processes, a further etching process is performed to isolate and expose the contact pads.

This process includes many processes and, in particular, many etching processes. Etching is a slow and, therefore, expensive manufacturing process.

For these and other reasons, there is a need for the present invention.

SUMMARY

One embodiment of the invention provides a non-leaded semiconductor package and a simpler and more cost-effective method for producing the package.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 4 illustrates a cross-sectional view of a section of the leadframe strip assembly of FIG. 3 after a die attach and a wire-bonding process.

FIG. 5 illustrates a cross-sectional view of a section of the leadframe strip assembly of FIG. 4 after a molding process.

FIG. 6 illustrates a cross-sectional view of a section of the leadframe strip assembly of FIG. 5 during a singulation process.

DETAILED DESCRIPTION

Figure 1:
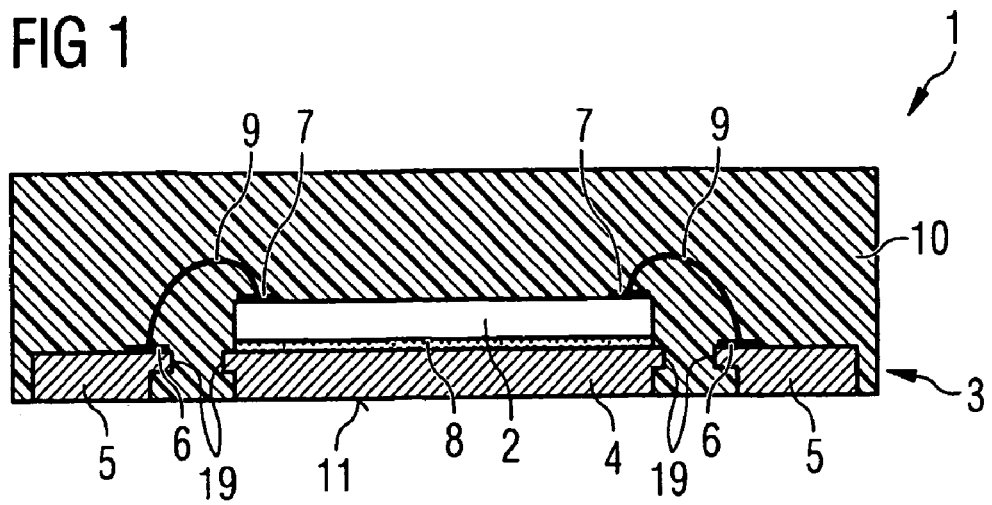
FIG. 1 illustrates a non-leaded semiconductor package according to the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, a non-leaded semiconductor package is assembled using a leadframe strip assembly. A method to produce the leadframe strip assembly according to the invention includes the following processes. A metal foil is provided and a carrier tape attached to one surface. A plurality of leadframes is then formed in the metal foil, each leadframe having a die pad or die attach pad laterally surrounded by a plurality of contact leads. Each leadframe includes the design of the desired semiconductor package. Preferably, the plurality of leadframes is formed by an etching process which is, more preferably, performed from one side of the metal foil. A plurality of isolated individual leadframes is formed.

By performing only one etching process the manufacturing process according to the invention is simplified. Performing the etching process from only one side of the metal foil leads to a simplification of the equipment required to form the leadframes and lower manufacturing costs.

In one embodiment, a plurality of leadframes is formed in the metal strip by laser cutting or stamping or any method known in the art. In this embodiment of the invention the leadframes are attached to each other by thin metal joining strips and form a continuous leadframe strip. The leadframe strip is then attached to the adhesive coating of a carrier tape. The metal joining strips are then removed by, for example, etching or by laser cutting to form a plurality of isolated leadframes attached to the carrier tape. The etching process is performed from only one side of the leadframe strip. This method has the advantage that the laser cutting or stamping process is relatively fast so that the manufacturing time is reduced.

The leadframe strip assembly according to the invention therefore includes a metal foil attached to a carrier tape. The metal foil includes a plurality of leadframes preferably arranged in a regular array of columns and rows in the metal foil. Each leadframe includes a die attach pad laterally surrounded by a plurality of contact leads. The arrangement of the contact leads and the die attach pad relates to the desired package design.

In one embodiment, the die pad and contact leads of each leadframe of the leadframe strip include anchorage features. The side walls of the die pad and inner side walls of the contact leads include protruding portions formed by an approximately square cut-out section at the base of the side walls. The protruding portion therefore extends approximately horizontally from the side walls of the die attach pad and inner side walls of the contact leads and typically has an approximately square cross-section. The upper surface of the protruding portion lies on approximately the same plane as the upper surface of the die attach pad and contact leads. This protruding portion is the anchorage feature which advantageously improves the reliability of the package.

In one embodiment, the die pad and contact leads of each leadframe of the leadframe strip assembly are spatially isolated from each other and, preferably, each leadframe of the metal foil of the leadframe strip assembly is spatially isolated from its neighbor. The die pad and contact leads of each leadframe are laterally isolated and are not attached to each other. Each leadframe is also laterally isolated and is not attached to the neighboring leadframes. The isolated leadframes are mechanically supported by the carrier tape. This arrangement of the leadframe strip assembly according to the invention is advantageous in that the cutting and stripping processes used in conventional leadframe manufacturing processes are avoided. This manufacturing line is therefore simplified.

By isolating the contact leads, a space is created between adjoining leadframes. Therefore, during the singulation process the contact leads are not cut which is extremely advantageous.

In one embodiment, the carrier tape includes a polyimide film with a silicone adhesive coating. This carrier tape material has the advantage that it has good heat resistance and, therefore, provides good mechanical support to the leadframes through the manufacturing process and, in particular, during the molding process. Also the adhesive can be cleanly removed from the bottom surface of the molded leadframe module or panel at the end of the manufacturing line just prior to the singulation of the individual semiconductor packages. This reduces the complex and costly cleaning processes.

In one embodiment, the metal foil includes copper or aluminum or one of their alloys and more preferably includes oxygen free high conductivity (OFHC) copper. These materials have good electrical conductivity, are relatively inexpensive and can be easily processed.

In one embodiment, the metal foil includes a thickness of approximately 1 mm to approximately 0.01 mm or more preferably approximately 0.25 mm to approximately 0.1 mm. The leadframe strip assembly according to the invention is advantageous in that the thickness of the metal foil which is used to form the plurality of leadframes can be thinner than that used in conventional processes as the carrier tape provides mechanical support. Also, in the method according to the invention the whole surface area of the metal strip is not thinned by an etching process to create leadframes of the desired thickness. The materials cost and manufacturing time is, therefore, reduced.

The leadframe strip may be partly or completely covered by an electro-plated coating. Different parts, such as the die attach pad, the contact leads and the contact areas of the contact leads, of a leadframe may be coated in different materials. The electro-plated coating may include silver, nickel/palladium/gold or nickel/nickel phosphorous.

In the next stage of the process a semiconductor die, which includes an active surface with a plurality of die contact pads and a passive surface, is attached to each die attach pad of the leadframe strip assembly. Each die is electrically connected to the leadframe by a plurality of bond wires connecting the die contact pads and the lead contact areas of the contact leads.

The plurality of dies attached to the leadframe strip assembly, contact leads, wire bonds and upper surface of the carrier tape are then encapsulated with mold material forming a panel or molded leadframe module. The mold material is typically a polymeric-based material.

A method to assemble a non-leaded semiconductor package according to the invention includes the following processes. The panel or molded leadframe module formed by the leadframe strip assembly process is provided and the carrier tape attached to the bottom surface is removed. The individual non-leaded semiconductor packages are singulated from the panel by sawing.

The sawing process may be performed by a saw blade, water jet or laser. The leadframe strip assembly according to the invention provides a panel in which the packages are singulated by cutting through only the mold material as the leadframe strip assembly includes isolated leadframes, die attach pads and contact leads. This greatly simplifies the sawing process.

If a saw blade is used to cut through two different materials, cracks can form between the two materials, burr formation is a problem and the wear rate of the saw blade is increased. Water jet technology is extremely slow and, therefore, may be impractical for high volume production as it is too costly. If a laser beam is used to cut through two types of material then the intensity must be adjusted which leads to a complicated process. These problems are avoided by the leadframe strip assembly according to the invention.

The leadframe strip assembly and the method of the invention is advantageously used to produce very thin quad flat non-leaded (VQFN) packages and particularly for packages of the pancake design leadframe which include a plurality of adjoining leadframes.

FIG. 1 illustrates a non-leaded semiconductor package 1 according to the invention. The package 1 includes a semiconductor die 2 and a leadframe 3. The leadframe 3 includes a die attach pad 4 in approximately its lateral centre which is laterally surrounded by a plurality of contact leads 5. The die attach pad 4 and contact leads 5 have essentially the same thickness and lie on essentially the same lateral plane. The inner ends of the contact leads 5 include lead contact areas 6. The side walls of the die attach pad 4 and the inner side wall of the contact leads 5 include a protruding portion 19 whose upper surface lies on approximately the same plane as that of the upper surface of the die attach pad or contact lead. The protruding portions 19 have an approximately square cross-section. The leadframe 3 includes oxygen-free high conductivity copper.

The semiconductor die 2 includes an active surface with a plurality of die contact pads 7 and a passive surface. The passive surface of the die 2 is attached approximately in the lateral centre of the die attach pad 4 by die attach material 8. The die 2 is electrically connected to the leadframe 3 by a plurality of bond wires 9 which connect the die contact pads 7 and the lead contact areas 6.

The upper surface of the die 2, contact leads 5, bond wires 9 and space between the die pad 4 and contact leads 5 is encapsulated with mold material 10. The bottom surface 11 of the non-leaded package 1 includes mold material 10 and the bottom surfaces of the die attach pad 4 and contact leads 5 on an essentially common plane. The outer side surfaces of the contact leads 5 are covered by a thin coating of the mold material 10. The outer sides of the semiconductor package 1 are essentially vertical. The bottom surfaces of the contact leads 5 provide the external contact areas of the package 1.

Figure 2:
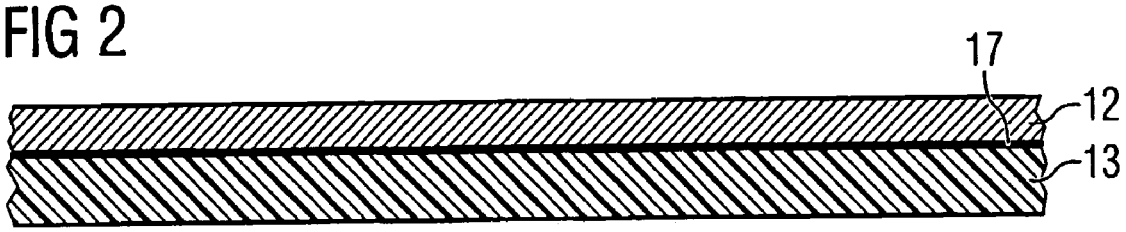
FIG. 2 illustrates a cross-sectional view of a section of a copper foil with a carrier tape according to the invention.

FIG. 2 illustrates a copper foil 12 attached to a carrier tape 13 in the first process of the method according to the invention to manufacture very thin quad flat non-leaded (VQFN) packages. The copper foil includes oxygen-free high conductivity copper and includes a thickness of between approximately 0.25 mm and approximately 0.1 mm. The copper strip 12 is attached to the adhesive coating 17 on the upper surface of a carrier tape 13 which includes a polyimide film substrate with a layer of silicone adhesive 17 on its upper surface.

Figure 3:
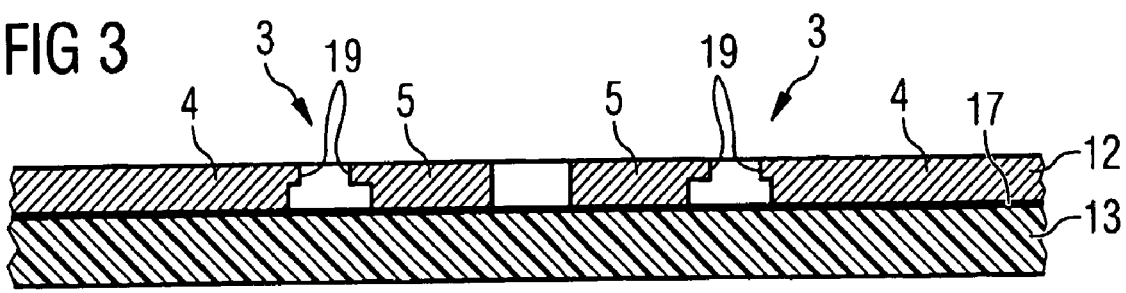
FIG. 3 illustrates a cross-sectional view of a section of the copper strip of FIG. 2 after an etching process to form a plurality of isolated leadframes, each having isolated contact leads.

FIG. 3 illustrates the next stage of the method according to the invention in which a plurality of leadframes 3 are formed in the copper foil 1. The leadframes 3 formed by a selective etching process which takes place on one side, from the top as illustrated in FIG. 2, of the copper strip 12. The upper surface of the carrier tape 13 acts as an etch stop.

The leadframes 3 are laterally arranged in a regular array of rows and columns in the copper foil 12. Each leadframe 3 includes a die attach pad 4 in the centre which is laterally surrounded by a plurality of contact leads 5. The lateral arrangement of the plurality of leadframes and the lateral arrangement of each individual leadframe cannot be seen in the cross-sectional views of the figures.

The contact leads 5 are separate from the die attach pad 4 and are not connected to each other. Each leadframe 3 is laterally isolated from the neighboring leadframes in the copper foil 12 and the bottom surface of each leadframe is attached to the adhesive coating 17 of the carrier tape 13. The carrier tape 13 provides the mechanical support to the isolated leadframes 3, each including an isolated die attach pad 4 and a plurality of isolated contact leads 5 during the next stages of the manufacturing process up to just prior to the singulation process.

In the next step in the process, illustrated in FIG. 4, a semiconductor die 2 is attached using die attach material 8 to the die pad 4 of each leadframe 3 in the copper foil 12. The semiconductor die 2 includes an active upper surface including a plurality of die contact pads 7. The inner portion of each contact lead 5 of the leadframe 3 also includes a contact area 6. The electrical connection between the contact pads 7 of the semiconductor die 2 and the contact areas 6 of the contact leads 5 of the leadframe 3 is formed by wire bonds 9.

FIG. 5 illustrates the molding process of the method according to the invention. The plurality of leadframes 3 is encapsulated by mold material 10 to form a molded leadframe module or panel 14. The die 2, die attach pad 4, contact leads 5, wire bonds 9 and areas between the contact leads 5, die attach pads 4 and the upper surface of the carrier tape 13 of each of a plurality of leadframes 3 are encapsulated by a single mass of mold material 10. The upper surface of the carrier tape 13 acts as the bottom surface of the mold. The mold material is then given an appropriate curing treatment.

FIG. 6 illustrates the final process of the process in which the carrier tape 13 is removed from the molded leadframe module 14. The bottom surface 16 of the molded leadframe module 14 includes mold material 10 and isolated areas having the bottom metal surfaces of the die attach pads 4 and isolated contact leads 5 on an essentially common surface. The individual non-leaded packages 1 are singulated from the molded leadframe module 14 by sawing through the mold material 10 between the individual leadframes 3 as indicated by the dotted lines 15 and saw blade 18.

Contacting means, such as solder balls, are then attached to the bottom surface of the contact leads 5 and provide the external contacts from the non-leaded package 1 to, for example, a printed circuit board. Alternatively, the solder balls may be attached to the contact leads 5 while the package forms part of the molded leadframe module. The packages 1 are then tested, packages and then mounted on, for example, a printed circuit board.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof

The invention claimed is:

1. A method to assemble a semiconductor package, comprising:
   providing a metal foil;
   attaching a carrier tape to a first side of the metal foil; and
   etching a second side of the metal foil opposite the first side to form a plurality of leadframes in the metal foil, each leadframe comprising a die pad laterally surrounded by a plurality of contact leads, wherein each of the leadframes is spatially isolated from neighboring leadframes, and wherein each of the contact leads and its respective die pad have a space therebetween with the contact leads and the die pad having protruding portions extending into the space.

2. The method of claim 1, wherein forming the plurality of leadframes by an etching process includes using a surface of the carrier tape as an etch stop.

3. The method of claim 1, further comprising:
   attaching a passive sides of a plurality of semiconductor dies to respective ones of the die pads of the plurality of isolated leadframes;
   electrically connecting die contact pads on the semiconductor dies to the contact leads by wire bonds;
   encapsulating the semiconductor chips, the wire bonds and the die pads in a mold material such that the space between the contact leads and respective die pads is filled with the mold materal; and thereafter
   removing the carrier tape to expose a planar surface formed by the mold material and bottom surfaces of the die pads and contact leads.

4. The method claim 3, further comprising:
   singulating the semiconductor packages by sawing through the mold material.

5. A leadframe strip assembly comprising:
   a carrier tape including a metal foil attached thereon; and
   a plurality of leadframes formed in the metal foil, each leadframe comprising a die pad laterally surrounded by a plurality of contact leads in the metal foil;
   the die pad and the contact leads each having sidewalls, wherein the contact leads are spaced apart from the die pads such that the sidewalls of the die pad and the contact leads form a space therebetween;
   the sidewalls of the die pad and the contact leads each having a protruding portion that extends into the space;
   wherein the die pads, the contact leads and the protruding portions each have an upper surface that lies in a common plane.

6. The leadframe strip assembly according to claim 5, wherein the die pad and contact leads of each leadframe of the metal foil have about the same thickness and lie on essentially a common lateral plane.

7. The leadframe strip assembly according to claim 5, wherein the protruding portions have a square cross section.

8. The leadframe strip assembly according to claim 5, wherein the carrier tape comprises a polyimide film with a silicone adhesive coating and the metal foil comprises OFHC Cu.

9. The leadframe strip assembly according to claim 5, wherein the metal foil comprises a thickness of approximately 1 mm to approximately 0.01 mm or approximately 0.25 mm to approximately 0.1 mm.

10. The leadframe strip assembly according to claim 5, further comprising a plurality of semiconductor dies attached to respective ones of the die pads, each semiconductor die including an active surface with a plurality of die contact pads, and a passive surface attached to the die attach pads, and a plurality of bond wires electrically connecting the die contact pads and the lead contact areas of the contact leads.

11. The leadframe strip assembly according to claim 10, wherein the plurality of semiconductor dies, the contact leads, the wire bonds and the upper surface of the carrier tape is encapsulated with a mold material.

12. A non-leaded semiconductor package comprising:

a leadframe comprising a die attach pad approximately in its lateral centre, laterally surrounded by a plurality of contact leads each having a contact area;

the die pad and the contact leads each having sidewalls, wherein the contact leads are spaced apart from the die pads such that the sidewalls of the die pad and the contact leads form a space therebetween:

the sidewalls of the die pad and the contact leads each having a protruding portion that extends into the space. wherein the die pads, the contact leads and the protruding portions each have an upper surface that lies in a common plane;

semiconductor die including an active surface with a plurality of die contact pads and a passive surface, wherein the passive surface is attached to the die attach pad by die attach material, and the active surface is electrically connected to the leadframe by a plurality of bond wires connecting the die contact pads and the lead contact areas of the contact leads;

the upper surface of the die, contact leads, bond wires and space between the die pad and contact leads being encapsulated with mold material; and the mold material, a bottom surface of the die attach pad and a bottom surface of the contact leads form an essentially common plane.

13. The non-leaded semiconductor package according to claim 12, wherein the leadframe comprises a thickness of approximately 1 mm to approximately 0.01 mm.

14. The non-leaded semiconductor package according to claim 12, wherein the leadframe comprises a thickness of approximately 0.25 mm to approximately 0.1 mm.

15. The non-leaded semiconductor package according to claim 12, wherein the carrier tape comprises a polyimide film with a silicone adhesive coating and the metal foil comprises OFHC Cu.

16. The non-leaded semiconductor package according to claim claim 12, wherein the metal foil comprises a thickness of approximately 1 mm to approximately 0.01 mm or approximately 0.25 mm to approximately 0.1 mm.

* * * * *